(12) United States Patent
Beckedahl et al.

(10) Patent No.: US 10,291,221 B2
(45) Date of Patent: May 14, 2019

(54) CONTROL DEVICE FOR A POWER SEMICONDUCTOR SWITCH

(71) Applicant: SEMIKRON ELEKTRONIK GMBH & CO. KG, Nuremberg (DE)

(72) Inventors: Peter Beckedahl, Oberasbach (DE); Gunter Königsmann, Langensendelbach (DE); Bastian Vogler, Fürth (DE); Markus Müller, Nuremberg (DE)

(73) Assignee: SEMIKRON ELEKTRONIK GmbH & CO. KG, Nuremberg (DE)

( * ) Notice: Subject to any disclaimer, the term of this patent is extended or adjusted under 35 U.S.C. 154(b) by 0 days.

(21) Appl. No.: 15/916,772

(22) Filed: Mar. 9, 2018

(65) Prior Publication Data

US 2018/0309436 A1 Oct. 25, 2018

(30) Foreign Application Priority Data

Apr. 25, 2017 (DE) .................. 10 2017 108 769

(51) Int. Cl.
*H03K 17/0812* (2006.01)
*G01R 19/165* (2006.01)
(Continued)

(52) U.S. Cl.
CPC . *H03K 17/08126* (2013.01); *G01R 19/16519* (2013.01); *H02M 1/32* (2013.01);
(Continued)

(58) Field of Classification Search
CPC ....... H03K 17/08126; H03K 17/08122; H03K 17/26; H02M 3/33507; G01R 19/16519
See application file for complete search history.

(56) References Cited

U.S. PATENT DOCUMENTS 7,149,098 B1 * 12/2006 Chen ................. H02M 1/32
363/56.09
9,236,801 B2 * 1/2016 Ouyang .............. H02M 3/158
(Continued)

FOREIGN PATENT DOCUMENTS

DE 102015120166 11/1916
DE 102016120166 11/1916

OTHER PUBLICATIONS

DE 10 2017 108 769.9, Office Action dated Mar. 12, 2018, 7 pages—German, 4 pages—English.

*Primary Examiner* — Emily P Pham
(74) *Attorney, Agent, or Firm* — Lackenbach Siegel, LLP; Andrew F. Young

(57) ABSTRACT

A control device for a power semiconductor switch, has a first, second and third electrical control device terminal, and a control device that according to a control signal generates an actuation voltage on the third control device terminal and actuates the power semiconductor switch. An overcurrent detection circuit determines a first voltage corresponding to a primary power semiconductor switch voltage present between the first and second control device terminals and, if the first voltage, further to commence the generation of an actuation voltage for a switch-on of the power semiconductor switch, and if the voltage exceeds a reference voltage, to generate an overcurrent detection signal. A blocking circuit blocks the output of the overcurrent detection signal from the overcurrent detection circuit, if a control current flowing in the third control device terminal for the actuation of the power semiconductor switch exceeds a first current value and/or is designed to block the output of the overcurrent detection signal from the overcurrent detection circuit, if the actuation voltage is smaller than a first voltage value.

13 Claims, 4 Drawing Sheets

(51) Int. Cl.
*H02M 3/335* (2006.01)
*H03K 17/26* (2006.01)
*H02M 1/32* (2007.01)
*H03K 17/082* (2006.01)
*H02M 1/00* (2006.01)

(52) U.S. Cl.
CPC .... *H02M 3/33507* (2013.01); *H03K 17/0828* (2013.01); *H03K 17/08122* (2013.01); *H03K 17/26* (2013.01); *H02M 2001/0009* (2013.01)

(56) References Cited

U.S. PATENT DOCUMENTS

| | | |
|---|---|---|
| 9,263,937 B2 * | 2/2016 | Nguyen ................ H02M 1/32 |
| 2014/0160601 A1 | 6/2014 | Ouyang |
| 2015/0162819 A1 | 6/2015 | Nguyen |

* cited by examiner

CONTROL DEVICE FOR A POWER SEMICONDUCTOR SWITCH

CROSS REFERENCE TO RELATED APPLICATIONS

This application relates to and claims priority from German Ser. No.: DE 10 2017 108 769.9 filed on Apr. 25, 2017, the entire contents of which are incorporated herein by reference.

FIGURE SELECTED FOR PUBLICATION

FIG. 1

BACKGROUND OF THE INVENTION

Field of the Invention

This application relates to a power semiconductor switch.

Description of the Related Art

From DE 10 2015 120 166 B3, the entire contents of which are incorporated herein by reference, a control device for a power semiconductor switch is known which monitors the load current flowing in a power semiconductor switch. Conventionally, if, in the switched-on state of the power semiconductor switch, the load current flowing in the power semiconductor switch becomes very large, e.g. in the event of a short-circuit, a primary power semiconductor switch voltage applied between a first and a second load current terminals rises substantially, thereby resulting in a damaging voltage rise in a control voltage of the control device which corresponds to the primary power semiconductor switch voltage.

Conventionally, if the monitoring voltage exceeds a reference voltage, an overcurrent detection circuit of the control device generates an overcurrent detection signal, which results in a switch-off of the power semiconductor switch, but often with an unfortunate time delay. The conventional power semiconductor switch is thus protected from the overcurrent flowing therein.

Unfortunately, in order to prevent spurious tripping, the control device is required to show a substantial ability withstand to the injection of parasitic voltages on the power semiconductor switch side.

Accordingly there is a need to address one of the concerns noted.

ASPECTS AND SUMMARY OF THE INVENTION

In one aspect of the present invention, an overcurrent detection circuit is be capable of detecting an overcurrent in the power semiconductor switch within the shortest possible time of the commencement of a generation of an actuation voltage for a switch-on of the power semiconductor switch, in order to permit the rapid detection of the overcurrent.

One alternative aspect of the invention is the disclosure of a control device for a power semiconductor, which shows a high withstand to the injection of parasitic voltages on the power semiconductor switch side and, in the event of the flow of an overcurrent in the power semiconductor switch, rapidly detects said overcurrent.

This object is fulfilled by a control device for a power semiconductor switch, having a first and second current load terminal and a control terminal, comprising: a first electrical control device terminal, which is provided for electrical connection with the first load current terminal, a second electrical control device terminal, which is provided for electrical connection with the second load current terminal, and a third electrical control device terminal, which is provided for electrical connection with the control terminal, an actuation device, which is designed to generate an actuation voltage on the third control device terminal, in response to a control signal, for the actuation of the power semiconductor switch, an overcurrent detection circuit, which is designed to determine a first voltage corresponding to the primary power semiconductor switch voltage which is present between the first and second control device terminals and, if said first voltage exceeds a reference voltage, further to the commencement of the generation of an actuation voltage for the switch-on of the power semiconductor switch, to deliver an overcurrent detection signal, a blocking circuit, which is designed to block the output of the overcurrent detection signal from the overcurrent detection circuit, if a control current flowing in the third control device terminal, the function of which is the actuation of the power semiconductor switch, is greater than a first current value, and/or is designed to block the output of the overcurrent detection signal from the overcurrent detection circuit, if the actuation voltage is smaller than a first voltage value.

According to one alternative aspect of the present invention, there is additionally provided a control device for a power semiconductor switch, has a first, second and third electrical control device terminal, and a control device that according to a control signal generates an actuation voltage on the third control device terminal and actuates the power semiconductor switch. An overcurrent detection circuit determines a first voltage corresponding to a primary power semiconductor switch voltage present between the first and second control device terminals and, if the first voltage, further to commence the generation of an actuation voltage for a switch-on of the power semiconductor switch, and if the voltage exceeds a reference voltage, to generate an overcurrent detection signal. A blocking circuit blocks the output of the overcurrent detection signal from the overcurrent detection circuit, if a control current flowing in the third control device terminal for the actuation of the power semiconductor switch exceeds a first current value and/or is designed to block the output of the overcurrent detection signal from the overcurrent detection circuit, if the actuation voltage is smaller than a first voltage value.

It is one alternative advantage of the present invention that if the blocking circuit is designed to block the output of the overcurrent detection signal from the overcurrent detection circuit and if a control current for the actuation of the power semiconductor switch, which flows in the third control device terminal, is greater than a first current value, then wherein the blocking circuit determines a second voltage which corresponds to the control current and, if the second voltage exceeds a second voltage value, and which blocks the output of the overcurrent detection signal from the overcurrent detection circuit. Accordingly, the magnitude of the control current can be monitored in an improved manner.

In this connection, it is advantageous if the blocking circuit incorporates an electrical control current detection resistor, through which the control current flows, wherein the second voltage is present in the form of the voltage across the control current detection resistor. The second voltage can thus be determined in a optimal manner.

Alternatively, in this connection, it is advantageous if the control device incorporates a first actuation control transistor which is designed, upon the switch-on thereof, to actuate the switch-on of the power semiconductor switch, wherein the first actuation transistor incorporates a current-sense output in which, upon the switch-on of the first actuation control transistor, a partial control current corresponding to the control current flows, wherein the blocking circuit is designed to determine the second voltage from the partial control current. Accordingly, the second voltage can be determined in a particularly simple manner. Moreover, an actuation transistor with a current-sense output can be integrated in an ASIC in a particularly optimal manner.

It is further advantageous if the blocking circuit is designed to block the output of the overcurrent detection signal from the overcurrent detection circuit, if a control current for the actuation of the power semiconductor switch flowing in the third control device terminal is greater that a first current value, wherein the blocking circuit determines a measured current which corresponds to the control current and, if the measured current is greater than a reference current corresponding to the first current value, the output of the overcurrent detection signal from the overcurrent detection circuit is blocked. The monitoring of the control current can thus be achieved in an optimal manner.

In this connection, it is advantageous if the control device incorporates a first actuation control transistor which is designed, upon the switch-on thereof, to actuate the switch-on of the power semiconductor switch, wherein the first actuation transistor incorporates a current-sense output in which, upon the switch-on of the first actuation control transistor, a partial control current corresponding to the control current flows, wherein the blocking circuit is designed to determine the measured current from the partial control current. The currents can thus be compared directly in a simple manner, with no prior conversion into a voltage variable. Moreover, a comparator circuit of this type can be integrated into an ASIC in a particularly optimal manner.

It is further advantageous if the overcurrent detection circuit is designed, if the first voltage exceeds a reference voltage after a specific waiting time with effect from the commencement of the generation of an actuation voltage for the switch-on of the power semiconductor switch, to generate an overcurrent detection signal, as the overcurrent detection circuit will then be blocked, under any circumstances, for a specific waiting time with effect from the commencement of the generation of an actuation voltage and thus, in the region of the waiting time, the injection of parasitic voltages from the power semiconductor switch side cannot result in any spurious tripping of the overcurrent detection circuit.

In this connection, it is advantageous if the waiting time assumes a value such that, at the end of the waiting time, the power semiconductor switch is not completely switched on, as the blocking of the overcurrent detection circuit with effect from the commencement of the generation of an actuation voltage for the switch-on of the power semiconductor switch is then very short.

It is further advantageous if the waiting time assumes a value such that, at the end of the waiting time, the first voltage is still greater than the reference voltage, as the blocking of the overcurrent detection circuit with effect from the commencement of the generation of an actuation voltage for the switch-on of the power semiconductor switch will then be extremely short.

It is further advantageous if the blocking circuit, for the blocking of the output of the overcurrent detection signal from the overcurrent detection circuit produces a blocking signal, wherein the overcurrent detection circuit is designed, upon the reception of the blocking signal, not to emit any overcurrent detection signal. Thus, in an optimal manner, the output of the overcurrent detection signal from the overcurrent detection circuit is blocked.

It is further advantageous if the reference voltage assumes a temporally constant voltage value, or assumes a decreasing voltage value, down to a minimum value, with effect from the commencement of the generation of an actuation voltage for the switch-on of the power semiconductor switch. If the reference voltage assumes a temporally constant value, the sensitivity of the overcurrent detection circuit is then temporally constant. If the reference voltage assumes a decreasing voltage value, down to a minimum value, with effect from the commencement of the generation of an actuation voltage for the switch-on of the power semiconductor switch, the sensitivity of the overcurrent detection circuit then increases over time, up to a specific maximum sensitivity. The sensitivity can thus be optimally sufficiently low at the outset to block the overcurrent detection circuit.

It is further advantageous if the control device is designed, in the presence of the overcurrent detection signal, to generate an actuation voltage for the switch-off of the power semiconductor switch. The power semiconductor switch, if the load current flowing therein becomes too great, thereby resulting in a risk of damage to the power semiconductor switch, can thus be reliably and rapidly switched off.

Moreover, a power semiconductor circuit having a power semiconductor switch and having a control device according to the invention for the power semiconductor switch, wherein the first control device terminal is electrically connected to the first load current terminal of the power semiconductor switch, the second control device terminal is electrically connected to the second load current terminal of the power semiconductor switch, and the third control device terminal is electrically connected to the control terminal of the power semiconductor switch, is advantageous, as this permits the rapid and reliable detection of an overcurrent flowing in the power semiconductor switch of the power semiconductor circuit.

The above and other aspects, features and advantages of the present invention will become apparent from the following description read in conjunction with the accompanying drawings, in which like reference numerals designate the same elements.

DETAILED DESCRIPTION OF THE PREFERRED EMBODIMENTS

Figure 1:
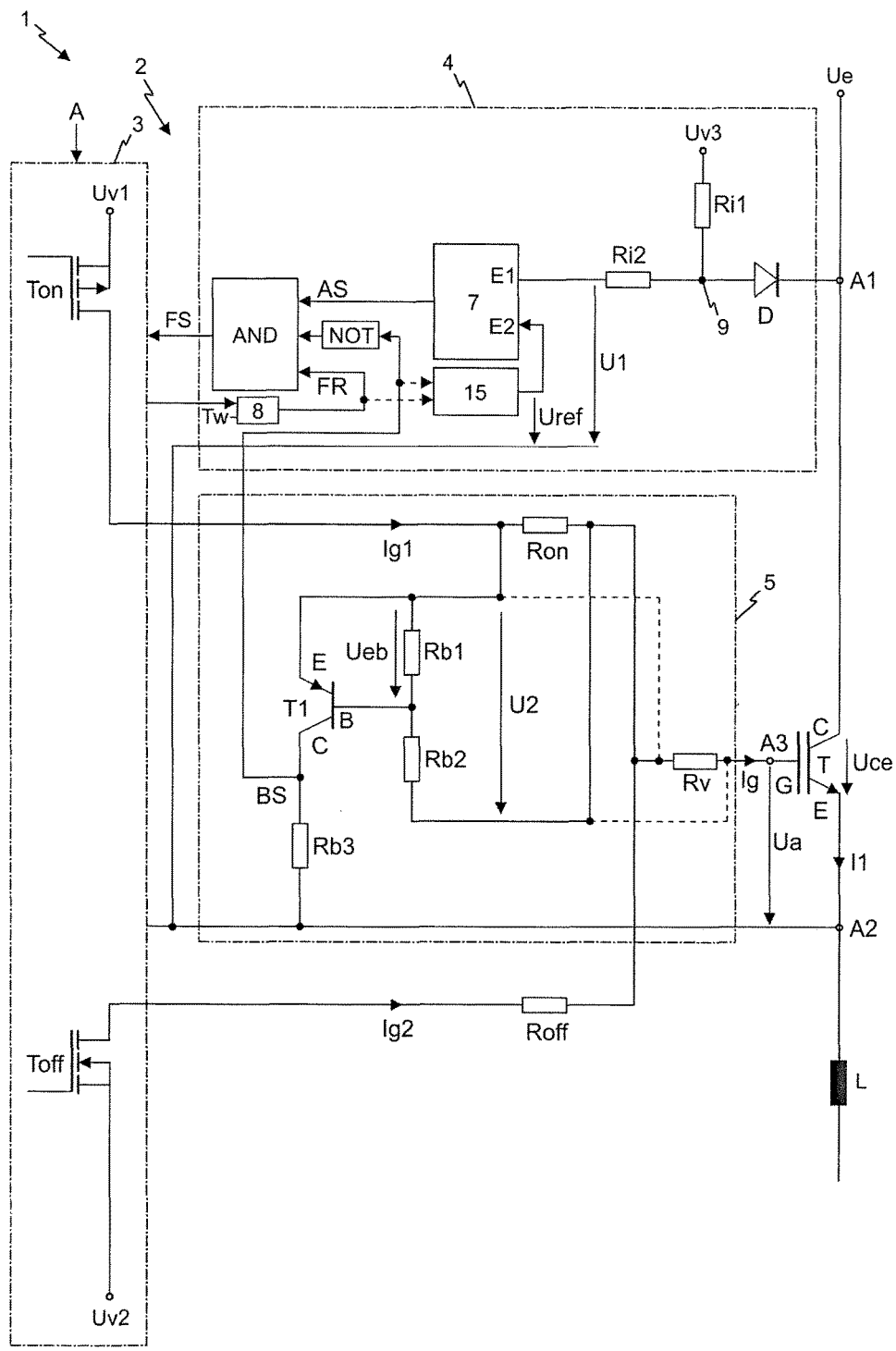
FIG. 1 shows a power semiconductor circuit with a power semiconductor switch, with one configuration of a control device according to the invention for the power semiconductor switch.

Reference will now be made in detail to embodiments of the invention. Wherever possible, same or similar reference numerals are used in the drawings and the description to refer to the same or like parts or steps. The drawings are in simplified form and are not to precise scale. The word 'couple' and similar terms do not necessarily denote direct and immediate connections, but also include connections through intermediate elements or devices. For purposes of convenience and clarity only, directional (up/down, etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

Various operations may be described as multiple discrete operations in turn, in a manner that may be helpful in understanding embodiments of the present invention; however, the order of description should not be construed to imply that these operations are order dependent.

It will be further understood by those of skill in the art that the apparatus and devices and the elements herein, without limitation, and including the sub components such as operational structures, circuits, communication pathways, and related elements, control elements of all kinds, display circuits and display systems and elements, any necessary driving elements, inputs, sensors, detectors, memory elements, processors and any combinations of these structures etc. as will be understood by those of skill in the art as also being identified as or capable of operating the systems and devices and subcomponents noted herein and structures that accomplish the functions without restrictive language or label requirements since those of skill in the art are well versed in related switch devices and operational controls and technologies and all their sub components, including various circuits and combinations of circuits without departing from the scope and spirit of the present invention.

Figure 2:
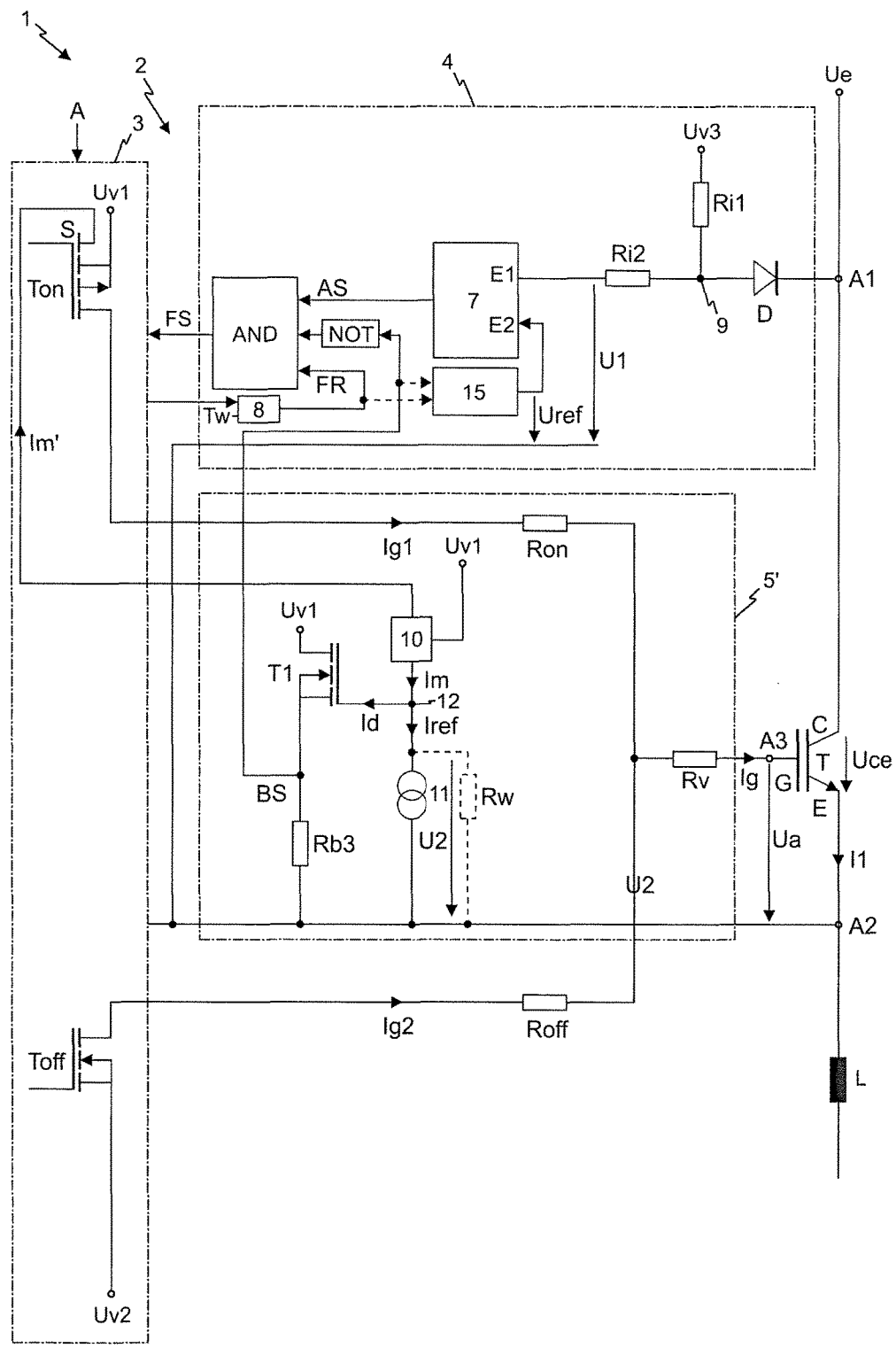
FIG. 2 shows a power semiconductor circuit with a power semiconductor switch, with a further configuration of a control device according to the invention for the power semiconductor switch.
Figure 3:
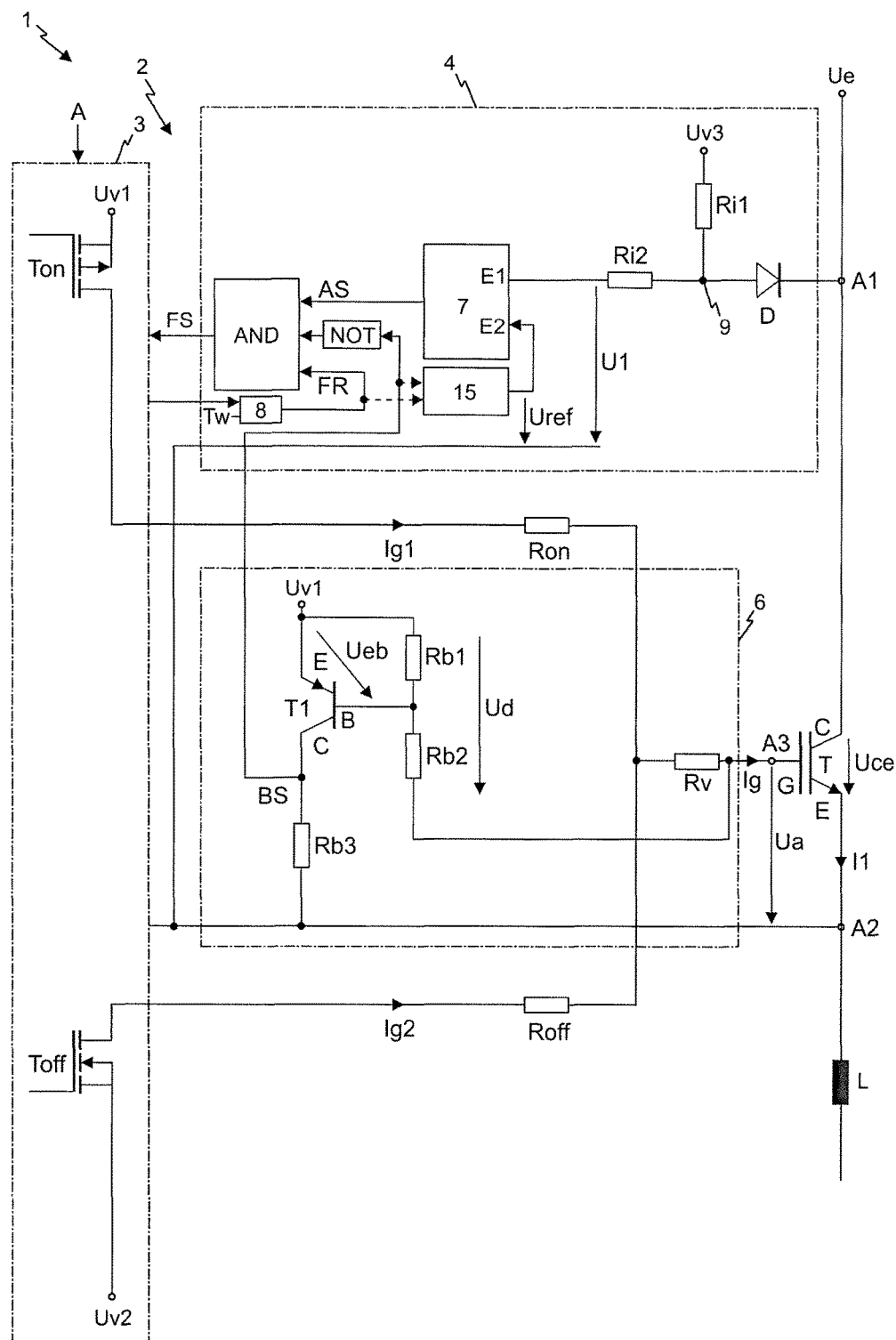
FIG. 3 shows a power semiconductor circuit with a power semiconductor switch, with a further configuration of a control device according to the invention for the power semiconductor switch.
Figure 4:
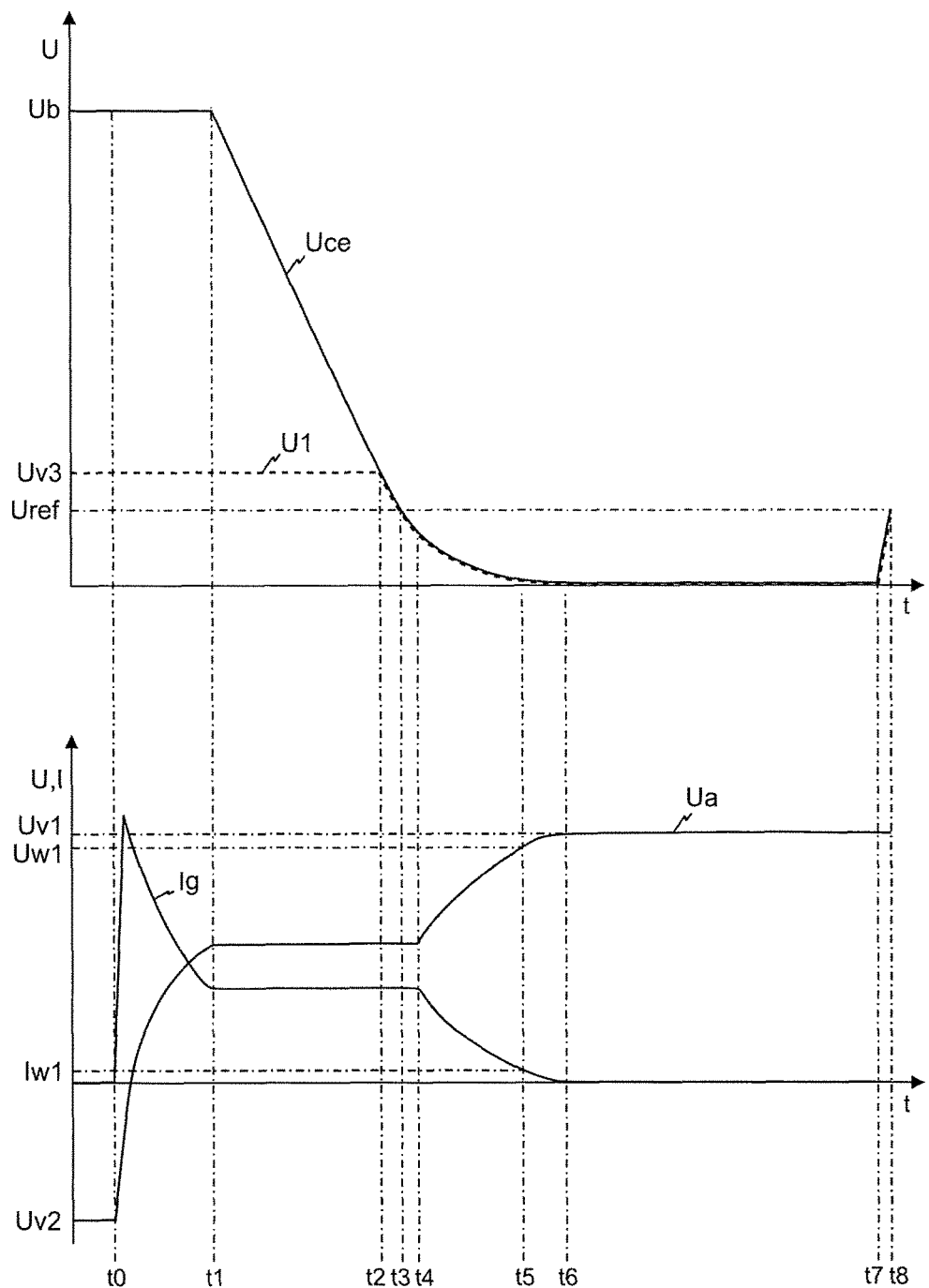
FIG. 4 shows the voltage and current characteristics in the power semiconductor circuit.

FIGS. 1 to 3 respectively represent a power semiconductor circuit 1 with a power semiconductor switch T, each with a different configuration of a control device 2 according to the invention for the power semiconductor switch T. FIG. 4 represents voltage and current characteristics in the power semiconductor circuit 1. In the figures, identical components are identified by the same reference symbols.

The power semiconductor switch T has a first and a second load current terminal C and E, and a control terminal G. In the context of the exemplary embodiments, a voltage Ue is present on the first load current terminal E of the power semiconductor switch T, and the second load current terminal E of the power semiconductor switch T is connected to an electrical load L (e.g. an electric motor) in an electrically conductive manner.

The power semiconductor switch T is preferably configured in the form of a transistor, such as e.g. an IGBT (Insulated Gate Bipolar Transistor) or a MOSFET (Metal Oxide Semiconductor Field Effect Transistor). In the context of the exemplary embodiments, the power semiconductor switch T is configured in the form of an IGBT, wherein the first load current terminal C is embodied by the collector of the IGBT, the second load current terminal E is embodied by the emitter of the IGBT, and the control terminal G is embodied by the gate of the IGBT.

The control device 2 has a first electrical control device terminal A1, which is provided for electrical connection to the first load current terminal C of the power semiconductor switch T, a second electrical control device terminal A2, which is provided for electrical connection to the second load current terminal E, and a third electrical control device terminal A3, which is provided for electrical connection to the control terminal G of the power semiconductor switch T.

The first control device terminal A1, in the power semiconductor circuit 1, is electrically connected to the first load current terminal C of the power semiconductor switch T, the second control device terminal A2 is electrically connected to the second load current terminal E of the power semiconductor switch T, and the third control device terminal A3 is electrically connected to the control terminal G of the power semiconductor switch T.

The control device 2 further incorporates an actuation device 3 which is configured, in response to a control signal A, to generate an actuation voltage Ua on the third control device terminal A3 for the actuation of the power semiconductor switch T. To this end, in accordance with a control signal A, which is generated e.g. by a superordinate control circuit (not represented), the actuation device 3 generates the actuation voltage Ua on the control device terminal A3, and thus on the control terminal G of the power semiconductor switch T. In the exemplary embodiments, the actuation device 3 generates an actuation voltage Ua of 15V for the switch-on of the power semiconductor switch T, and an actuation voltage Ua of −8V for the switch-off of the power semiconductor switch T. The power semiconductor switch T switches on and off in accordance with the voltage value of the actuation voltage Ua. The actuation device 3 incorporates a first actuation control transistor Ton which is designed, upon the switch-on thereof, to actuate the switch-on of the power semiconductor switch T. The first actuation control transistor Ton, upon the switch-on thereof, connects a first voltage source (not represented) which generates a switch-on voltage Uv1, in this case 15V, in an electrically conductive manner, preferably via at least one intermediate electrical resistor Ron or Rv, to the third control device terminal A3, and thus to the control terminal G of the power semiconductor switch T. The actuation device 3 further incorporates a second actuation control transistor Toff which is designed, upon the switch-on thereof, to actuate the switch-off of the power semiconductor switch T. The second actuation control transistor Toff, upon the switch-on thereof, connects a second voltage source (not represented) which generates a switch-off voltage Uv2, in this case −8V, in an electrically conductive manner, preferably via at least one intermediate electrical resistor Roff or Rv, to the third electrical control device terminal A3, and thus to the control terminal G of the power semiconductor switch T. The first and second actuation control transistors Ton and Toff are switched on and off in a mutually alternating manner, i.e. if the first actuation control transistor Ton is switched on, the second actuation control transistor Toff is switched off, and vice versa.

The control device 2 further incorporates an overcurrent detection circuit 4, which is designed to determine a first voltage U1, corresponding to the primary power semiconductor switch voltage Uce which is present between the first and second control device terminals A1 and A2 and, if the first voltage U1, after the commencement t0 of the generation of an actuation voltage Ua for the switch-on of the power semiconductor switch T, exceeds a reference voltage Uref, to generate an overcurrent detection signal FS. FIG. 4 represents the voltage and current characteristics associated with the switching process of the power semiconductor switch T in the power semiconductor circuit 1. At time t0, the generation occurs of an actuation voltage Ua for the switch-on of the power semiconductor switch T, i.e. the second actuation control transistor Toff is switched off and the first actuation control transistor Ton is switched on, as a result of which the gate capacitance of the power semiconductor switch T is transferred, and the actuation voltage Ua rises from the switch-off voltage Uv1 (−8V) at time t0 to the switch-on voltage Uv2 (+15V) at time t6. Between times t1 and t4, the actuation voltage Ua passes through the Miller Plateau. At time t6, the switch-on process of the power semiconductor switch T is complete.

The overcurrent detection circuit 4 incorporates a diode D, a first and a second overcurrent detection resistor Ri1 and Ri2, a third voltage source (not represented) which generates a first supply voltage Uv3, in this case 10V, a reference voltage generation unit 15, which generates a reference voltage Uref, and a comparator 7. The power semiconductor switch T is preferably configured as an n-channel power semiconductor switch, more accurately described as an n-channel IGBT, wherein the cathode of the diode D is electrically arranged to face the first control device terminal A1, and is electrically connected to the first control device terminal A1. The diode D, and the first and second overcurrent detection resistors Ri1 and Ri2 are mutually connected in an electrically conductive manner via a circuit node point 9, wherein the second overcurrent detection resistor Ri2 is electrically connected between a first input of the comparator 7 and the circuit node point 9, the diode D is electrically connected between the circuit node point 9 and the first control device terminal A1, and the first overcurrent detection resistor Ri1 is electrically connected between the circuit node point 9 and the third voltage source. The second overcurrent detection resistor Ri2 functions as a snubber for the first input of the comparator 7, and does not necessarily need to be present. In the exemplary embodiments, the resistance value of the first overcurrent detection resistor Ri1 is 3.3 kΩ, and the resistance value of the second overcurrent detection resistor Ri2 is 512Ω. In the exemplary embodiment, the reference voltage Uref assumes a constant voltage value, but can also show a declining voltage value with effect from time t0, down to a minimum value. In this regard, the reference voltage Uref can be present e.g. in the form of a voltage across a capacitor, which is discharged with effect from time t0 by means of a resistor. If the first voltage U1 which is present on the first input E1 of the comparator 7 is greater than the reference voltage Uref which is present on the second input E2 of the comparator 7, the comparator 7 generates an overcurrent detection pre-signal AS. The diode D protects the overcurrent detection circuit 4 from the primary power semiconductor switch voltage Uce, if the primary power semiconductor switch voltage Uce assumes an excessively high value. After time t1, the power semiconductor switch T begins its transition to a conducting state, and the primary power semiconductor switch voltage Uce begins to decay rapidly. If the primary power semiconductor switch voltage Uce, ignoring the diode voltage drop across the diode D, is smaller than the first supply voltage Uv3, the diode D begins to conduct, and the first voltage U1 corresponds to the primary power semiconductor switch voltage Uce.

It will be observed that, within the meaning of the invention, the expression to the effect that a second electrical variable is determined which corresponds to a first electrical variable, or that a second electrical variable corresponds to a first electrical variable, implies that, at least within a specific range of values for the first variable, the second variable is at least approximately proportional to the first variable.

In order to prevent any spurious tripping of the overcurrent detection circuit 4, the control device 3, upon the commencement t0 of the generation of an actuation voltage Ua for the switch-on of the power semiconductor switch T, transmits a release signal FR to the overcurrent detection circuit 4 which, where applicable, can be delayed by means of a time-delay element 8, which delays the release signal FR by a specific waiting time Tw. In the context of the exemplary embodiment, the release signal FR is logically ANDed with the overcurrent detection signal AS by means of an AND element, such that the overcurrent detection circuit 4, at the earliest, can transmit the overcurrent detection signal FS directly after the commencement t0 of the generation of an actuation voltage Ua for the switch-on of the power semiconductor switch T.

In order to prevent any spurious tripping on the grounds that, during the switch-on process of the power semiconductor switch T, the first voltage U1 does not undershoot the reference voltage Uref until time t3, the overcurrent detection circuit 4 must be blocked at least until time t3. For the execution of this blocking, the control device 2, as represented in an exemplary manner in FIG. 1, incorporates a blocking circuit 5, which is designed to block the output of the overcurrent detection signal FS from the overcurrent detection circuit 4, if a control current Ig flowing in the third control device terminal A3 for the actuation of the power semiconductor switch T is greater than a first current value. Upon the switch-on of the power semiconductor switch T, the control current Ig flows through the switch-on resistor Ron and through the gate series resistor Rv, which is connected in series with the gate of the semiconductor switch T as, upon the switch-on of the power semiconductor switch T, the second actuation control transistor Toff is switched off. Consequently, upon the switch-on of the power semiconductor switch T, the current Ig1 flowing in the switch-on resistor Ron corresponds to the control current Ig. In the exemplary embodiment, a second voltage U2 across the switch-on resistor Ron is determined on the basis of the current Ig1. The second voltage U2 corresponds to the control current Ig. If the second voltage U2 is greater than a second voltage value which, in the exemplary embodiment, is the case up to time t5, the output of the overcurrent detection signal FS from the overcurrent detection circuit 4 is blocked. To this end, the second voltage U2 is reduced by means of the sequentially electrically connected first and second blocking circuit resistors Rb1 and Rb2, wherein the voltage Ueb is present across the first resistor Rb1. If the voltage Ueb exceeds a voltage value of 0.7 V, a transistor T1, the base and emitter of which are electrically connected to the first blocking circuit resistor RB1, the collector of which, via a third blocking circuit resistor Rb3, is electrically connected to the second control device terminal A2, and the emitter of which is connected to the first actuation control transistor Ton, is switched on. Consequently, a high-level logic state is present on the collector of the transistor T1, which is routed in the form of a blocking signal BS as an input signal to the overcurrent detection circuit 4. The blocking signal BS is logically negated by means of a NOT-element, and the negated signal is routed to the AND-element as an input signal. In the presence of a blocking signal BS, the output of the overcurrent detection signal FS is thus blocked by the blocking circuit 5. The second voltage value, and consequently the first current value Iw1 (see FIG. 4), proceeds from the voltage value of 0.7V, where the latter is back-calculated in accordance with the ratio of the blocking circuit resistors Rb1 and Rb2 and, where applicable, the ratio of the switch-on resistor Ron to a corresponding value of the second voltage U2, or of the current Ig1 or Ig. In the exemplary embodiment, the resistance value of the switch-on resistor Ron is 5Ω, the resistance value of the first blocking circuit resistor Rb1 is 22.1 kΩ, a the resistance value of the second blocking circuit resistor Rb2 is 56.8 kΩ, and the resistance value of the third blocking circuit resistor Rb3 is 10 kΩ, such that the second voltage value is 2.5V, and consequently the first current value Iw1 is 0.5 A. If the control current Ig is greater than the first current value, which is the case in the exemplary embodiment up to time t5, the output of the overcurrent detection signal FS from the overcurrent detection circuit 4 is blocked by the blocking circuit 5. As represented by the broken line in FIG. 1, the second voltage U2, rather than the voltage across the switch-on resistor Ron, can also be present in the form of the voltage across the gate series resistor Rv. The gate series resistor Rv can have a resistance value e.g. of 5Ω.

It should be observed that the gate series resistor Rv can also be integrated into the power semiconductor switch T, such that the control terminal of the power semiconductor switch T is not directly present in the form of the gate G of the power semiconductor switch T, but in the form of an electrical terminal of the gate series resistor Rv. It should further be observed that the resistors Ron and Roff are generally present in any event, such that the latter are not generally additionally required for the constitution of the blocking circuit 5.

In actual operation, the time t3 with effect from which the first voltage U1 undershoots the reference voltage Uref varies substantially, and is dependent upon numerous factors, including e.g. the voltage load, current load, temperature load and manufacturing tolerances for the power semiconductor switch T. Moreover, between time t0 and time t6, high parasitic voltages occur, which can lead to unwanted voltage variations in the first voltage U1. In actual operation, in general, in the control device described in DE 10 2015 120 166 B3, it is necessary for the waiting time by which the release signal FR is delayed to be selected with a relatively long value, such that the overcurrent detection circuit, in order to prevent any spurious tripping, can only be released by means of the release signal FR some time after time t6 (see FIG. 4).

In the invention, by means of the blocking circuit 5, which monitors the control current Ig, it is ensured that, independently of the voltage load, current load, temperature load and manufacturing tolerances for the power semiconductor switch T, the blocking circuit 5 only blocks the overcurrent detection circuit 4 up to time t5 (see FIG. 4), which lies shortly before the end of the switch-on process of the power semiconductor switch T. Moreover, by means of the additional monitoring of the control current Ig, the withstand of the control device 2 to injected parasitic voltages is significantly increased, and the probability of the spurious tripping of the overcurrent detection circuit 4 is thus significantly reduced.

The waiting time Tw preferably assumes a value such that, at the end of the waiting time Tw, the power semiconductor switch T is not yet completely switched on. Specifically, the waiting time Tw assumes a value such that, at the end of the waiting time Tw, the first voltage U1 is still greater than the reference voltage Uref. The waiting time Tw can e.g. assume a value such that the waiting time Tw ends between time t0 and time t1, or between time t1 and time t2.

It should be observed that, in general, the blocking circuit 5 determines a second voltage U2 which corresponds to the control current Ig and, if the second voltage exceeds a second voltage value U2, blocks the output of the overcurrent detection signal FS from the overcurrent detection circuit 4. In the configuration of the invention according to FIG. 1, the second voltage U2 is present in the form of the voltage across the switch-on resistor Ron, or the voltage across the gate series resistor Rv, but this is not necessarily the case. Alternatively, the second voltage U2, for example, can also be measured by a current measuring device (e.g. a Hall-effect sensor), which measures the control current Ig or Ig1, generated as an output variable and routed to the blocking circuit 5 as an input variable.

FIG. 2 represents a further configuration of a control device 2 according to the invention for the power semiconductor switch T, which is consistent with the control device 2 according to FIG. 1, with respect to the configuration of its blocking circuit 5'. To this end, the blocking circuit 5' is configured to block the output of the overcurrent detection signal FS from the overcurrent detection circuit 4, if the control current Ig flowing in the third control device terminal A3, for the actuation of the power semiconductor switch T, is greater than a first current value Iw1, wherein the blocking circuit 5' determines a measured current Im which corresponds to the control current Ig and, if the measured current is greater than a reference current Iref which corresponds to the first current value Iw1, blocks the output of the overcurrent detection signal FS from the overcurrent detection circuit 4. Preferably, the first actuation control transistor Ton incorporates a current-sense output S in which, when the first actuation control transistor Ton is switched on, a partial control current Im' which corresponds to the control current Ig flows, wherein the blocking circuit 5' is configured to determine the measured current Im from the partial control current Im'. To this end, a current mirror amplification device 10 of the blocking circuit 5' internally mirrors the partial control current Im', amplifies the mirrored partial control current Im', and delivers the amplified mirrored partial control current fin' as a measured current output Im. The blocking circuit 5' further incorporates a transistor T1, on the drain of which the switch-on voltage Uv1 is present, and the source of which, via a third blocking circuit resistor Rb3, which preferably has a resistance value of 200 kΩ, is connected to the second control device terminal A2 in an electrically conductive manner. The blocking circuit 5' further incorporates a current source 11 for the generation of the reference current Iref which, at a circuit node point 12, is connected to the current mirror amplification device 10 and the gate of the transistor T1 in an electrically conductive manner. In the circuit node point 12, the measured current Im is compared with the reference current Iref and, if the measured current Im is greater than the reference current Iref, the differential current Id (Id=Im−Iref) flows to the gate of the transistor T1, such that the latter is switched on. Consequently, a high-level logic state is present on the source of the transistor T1, which is routed in the form of a blocking signal BS as an input signal to the overcurrent detection circuit 4. The blocking signal BS is logically negated by means of a NOT-element, and the negated signal is routed to the AND-element as an input signal. In the presence of a blocking signal BS, the output of the overcurrent detection signal FS is thus blocked by the blocking circuit 5'.

Alternatively, the blocking circuit 5' can also be configured to determine the second voltage U2 from the partial control current Im', as represented in an exemplary manner in FIG. 2. To this end, from the measured current Im generated by the current mirror amplification device 10, e.g. by means of a further electrical resistor Rw, which is connected in the circuit in place of the current source 11, the second voltage U2 is determined. This is observed as a voltage drop across the electrical resistor Rw. If the second voltage U2 has achieved a specific value (e.g. 4.5V), the conductivity of the transistor T1 will be sufficient such that a high-level logic state is present on the source of the transistor T1, which is routed in the form of a blocking signal BS as an input signal to the overcurrent detection circuit 4.

FIG. 3 represents a further configuration of a control device 2 according to the invention for the power semiconductor switch T, which is consistent with the control device 2 according to FIG. 1, with respect to the configuration of its blocking circuit 6. To this end, the blocking circuit 6 is configured to block the output of the overcurrent detection signal FS from the overcurrent detection circuit 4, if the actuation voltage Ua is smaller than a first voltage value Uw1 (see FIG. 4). In the exemplary embodiment, the first voltage value Uw1, upon the switch-on of the power semiconductor switch T, is exceeded at time t5 such that, at time t5, the blocking of the output of the overcurrent detection signal FS by the blocking circuit 6 is discontinued.

To this end, in the blocking circuit 6, by means of the sequentially electrically connected first and second blocking circuit resistors Rb1 and Rb2, the differential voltage Ud between the switch-on voltage Uv1 and the actuation voltage Ua (Ud=Uv1−Ua) is reduced, wherein the voltage Ueb is present across the first resistor Rb1. If the voltage value of the voltage Ueb is greater than 0.7V, the transistor T1, the base and emitter of which are electrically connected to the first blocking circuit resistor Rb1, the collector of which, via a third blocking circuit resistor Rb3 is electrically connected to the second control device terminal A2, and on the emitter of which the switch-on voltage Uv1 is present, is switched on. Consequently, a high-level logic state is present on the collector of the transistor T1, which is routed in the form of a blocking signal BS as an input signal to the overcurrent detection circuit 4. In the presence of a blocking signal BS, the output of the overcurrent detection signal FS by the blocking circuit 6 is blocked. The first voltage value Uw1 proceeds from the voltage value of 0.7V, where the latter, in accordance with the ratio of the blocking circuit resistors Rb1 and Rb2, is back-calculated from a corresponding value of the actuation voltage Ua. In the exemplary embodiment, the resistance value of the first blocking circuit resistor Rb1 is 22.1 kΩ, the resistance value of the second blocking circuit resistor Rb2 is 28.4 kΩ, and the resistance value of the third blocking circuit resistor Rb3 is 10 kΩ, such that the first voltage value Uw1 is 13.4V.

It should be observed that the blocking circuit can also be configured such that the latter comprises the blocking circuit 5 or 5' and the blocking circuit 6, and the blocking signals BS thereof are mutually logically ORed, e.g. by means of an OR-element, with a common blocking signal, such that the blocking circuit 5 or 5' and the blocking circuit 6 are present in parallel, and the blocking circuit is thus configured to block the output of the overcurrent detection signal FS from the overcurrent detection circuit, if the control current Ig flowing in the third control device terminal A3 for the actuation of the power semiconductor switch T is greater than a first current value Iw1 and, to this end, is configured to block the output of the overcurrent detection signal FS from the overcurrent detection circuit 4, if the actuation voltage Ua is smaller than a first voltage value Uw1. By this arrangement, a particularly high withstand of the control device 2 to injected parasitic voltages can be achieved.

It should be observed that, in all three exemplary embodiments, as represented by the broken lines in FIG. 1 to FIG. 3, the blocking of the output of the overcurrent detection signal FS does not necessarily need to proceed by means of an AND-element, but can also proceed wherein, in accordance with the release signal FR and/or the blocking signal BS, the generation of the overcurrent detection pre-signal AS by the reference voltage generation unit 6 is blocked, wherein the latter, if the output of the overcurrent detection signal FS is to be blocked, generates the reference voltage Uref such that the voltage value thereof is still greater than the voltage value of the first supply voltage Uv3, as the first voltage U1 present on the first input E1 of the comparator 7 is then still smaller than the reference voltage Uref present on the second input E2 of the comparator 7. Alternatively, in a manner not represented in FIGS. 1 to 3, in the interests of clarity, the blocking of the output of the overcurrent detection signal FS can also proceed wherein, in accordance with the release signal FR and/or the blocking signal BS, the generation of the overcurrent detection signal AS by the reference voltage generation unit 6 is blocked, wherein, if the output of the overcurrent detection signal FS is to be blocked, a semiconductor switch, which connects the first input E1 of the comparator 7 with the second control device terminal A2 in an electrically conductive manner, is switched on or closed, and the voltage on the first input E1 of the comparator 7 is thus set to a voltage value of zero.

The actuation device 3 is preferably configured, in the presence of or upon the reception of the overcurrent detection signal FS, to generate an actuation voltage Ua for the switch-off of the power semiconductor switch T, such that the power semiconductor switch T, if the load current I1 flowing therein becomes very large, e.g. in the event of a short-circuit, is switched off.

The actuation device 3 can be provided e.g. in the form of a single integrated circuit or a plurality of integrated circuits, wherein the single integrated circuit or the plurality of integrated circuits can be integrated in at least one ASIC where, where applicable, additional discrete electrical components can be present.

It should be further observed that, within the meaning of the invention, the term "emitter" also includes a terminal which is analogous to the emitter in another type of power semiconductor, and the term "collector" also includes the terminal which is analogous to the gate in another type of power semiconductor switch. In a MOSFET, e.g. in technical terms, the terminal which is designated as the "emitter" in an IGBT is designated as the "source", and the terminal which is designated as the "collector" in an IGBT is designated as the "drain". It should therefore be observed that, within the meaning of the present invention, the term "emitter" also encompasses the term "source", and the term "collector" also encompasses the term "drain".

It should further be observed, naturally, that characteristics of different exemplary embodiments of the invention, provided that said characteristics are not mutually exclusive, can be mutually combined as required, without departing from the scope of the invention.

Although only a few embodiments have been disclosed in detail above, other embodiments are possible and the inventors intend these to be encompassed within this specification. The specification describes certain technological solutions to solve the technical problems that are described expressly and inherently in this application. This disclosure describes embodiments, and the claims are intended to cover any modification or alternative or generalization of these embodiments which might be predictable to a person having ordinary skill in the art.

Also, the inventors intend that only those claims which use the words "means for" are intended to be interpreted under 35 USC 112, sixth paragraph. Moreover, no limitations from the specification are intended to be read into any claims, unless those limitations are expressly included in the claims. It will be recognized by those of skill in the art of circuit design and component design and controller arrangements for circuits that the disclosure herein includes and discloses sufficient structure and structural arrangements to enable those of skill in the art to understand the scope and spirit of the present invention.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:

1. A control device for a power semiconductor switch, having a first and a second load current terminal and a control terminal, comprising:
   a first electrical control device terminal, that provides for electrical connection with the first load current terminal;
   a second electrical control device terminal, that provides for electrical connection with the second load current terminal;
   and a third electrical control device terminal, that provides for electrical connection with the control terminal;
   an actuation device, which is designed to generate an actuation voltage (Ua) on the third control device terminal, in response to a control signal (A), for an actuation of the power semiconductor switch;
   an overcurrent detection circuit, which is designed to determine a first voltage (U1) corresponding to the primary power semiconductor switch voltage (Uce) which is present between the first and the second control device terminals and, if said first voltage (U1) exceeds a reference voltage (Uref), further to a commencement (t0) of the generation of an actuation voltage (Ua) for a switch-on of the power semiconductor switch, to deliver an overcurrent detection signal (FS); and
   a blocking circuit that blocks the output of the overcurrent detection signal (FS) from the overcurrent detection circuit if a control current (Ig) flowing in the third control device terminal, the function of which is the actuation of the power semiconductor switch, is greater than a first current value (Iw1), and that also blocks the output of the overcurrent detection signal (FS) from the overcurrent detection circuit if the actuation voltage (Ua) is smaller than a first voltage value (Uw1).

2. The control device, according to claim 1, wherein:
   the blocking circuit blocks the output of the overcurrent detection signal (FS) from the overcurrent detection circuit if a control current (Ig) for the actuation of the power semiconductor switch, which flows in the third control device terminal, is greater than a first current value (Iw1), wherein the blocking circuit determines a second voltage (U2) which corresponds to the control current (Ig) and, if the second voltage (U2) exceeds a second voltage value, blocks the output of the overcurrent detection signal (FS) from the overcurrent detection circuit.

3. The control device, according to claim 2, wherein:
   the blocking circuit incorporates an electrical control current detection resistor (Ron, Rv) through which the control current (Ig) flows, wherein the second voltage (U2) is present in the form of the voltage across the control current detection resistor (Ron, Rv).

4. The control device, according to claim 2, wherein:
   the control device includes a first actuation control transistor, which is designed, upon the switch-on thereof, to actuate the switch-on of the power semiconductor switch, wherein the first actuation transistor incorporates a current-sense output in which, upon the switch-on of the first actuation control transistor, a partial control current (Im') corresponding to the control current (Ig) flows, wherein the blocking circuit is designed to determine the second voltage (U2) from the partial control current (Im').

5. The control device, according to claim 1, wherein:
   the blocking circuit is designed to block the output of the overcurrent detection signals (FS) from the overcurrent detection circuit, if a control current (Ig) for the actuation of the power semiconductor switch flowing in the third control device terminal is greater that a first current value (Iw1), wherein the blocking circuit determines a measured current (Im) which corresponds to the control current (Ig) and, if the measured current (Im) is greater than a reference current (Iref) corresponding to the first current value (Iw1), the output of the overcurrent detection signal (FS) from the overcurrent detection circuit is blocked.

6. The control device, according to claim 5, wherein:
   the control device incorporates an actuation control transistor (Ton) which is designed, upon the switch-on thereof, to actuate the switch-on of the power semiconductor switch, wherein the first actuation transistor incorporates a current-sense output in which, upon the switch-on of the first actuation control transistor, a partial control current (Im') corresponding to the control current (Ig) flows, wherein the blocking circuit is designed to determine the measured current (Im) from the partial control current (Im').

7. The control device, according to claim 2, wherein:
   the overcurrent detection circuit is designed, if the first voltage (U1) exceeds a reference voltage (Uref) after a specific waiting time (Tw) with effect from the commencement (t0) of the generation of an actuation voltage (Ua) for the switch-on of the power semiconductor switch, to generate an overcurrent detection signal (FS).

8. The control device, according to claim 7, wherein:
   the waiting time (Tw) assumes a value such that, at the end of the waiting time (Tw), the power semiconductor switch is not completely switched on.

9. The control device, according to claim 7, wherein:
   the waiting time (Tw) assumes a value such that, at the end of the waiting time (Tw), the first voltage (U1) is still greater than the reference voltage (Uref).

10. The control device, according to claim 1, wherein:
    the blocking circuit generates a blocking signal (BS) for the blocking of the output of the overcurrent detection signal (FS) from the overcurrent detection circuit, wherein the overcurrent detection circuit is designed, upon the reception of the blocking signal (BS), to generate no overcurrent detection signal (FS).

11. The control device, according to claim 10, wherein:
the reference voltage (Uref) assumes a temporally constant voltage value, or assumes a decreasing voltage value, down to a minimum value, with effect from the commencement (t0) of the generation of an actuation voltage (Ua) for the switch-on of the power semiconductor switch.

12. The control device, according to claim 11, wherein:
the control device that, in the presence of the overcurrent detection signal (FS), generates an actuation voltage (Ua) for the switch-off of the power semiconductor switch.

13. A power semiconductor circuit having a power semiconductor switch and having a control device for the power semiconductor switch, which is configured according to claim 1, wherein:
the first control device terminal is electrically connected to the first load terminal of the power semiconductor switch, the second control device terminal is electrically connected to the second load terminal of the power semiconductor switch, and the third control device terminal is electrically connected to the control terminal of the power semiconductor switch.

* * * * *